United States Patent
Okamoto

(10) Patent No.: US 9,153,930 B2
(45) Date of Patent: Oct. 6, 2015

(54) LASER LIGHT SOURCE

(71) Applicant: NEC CORPORATION, Tokyo (JP)

(72) Inventor: Takeshi Okamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/460,233

(22) Filed: Aug. 14, 2014

(65) Prior Publication Data

US 2015/0063398 A1 Mar. 5, 2015

(30) Foreign Application Priority Data

Sep. 4, 2013 (JP) .................................. 2013-182789

(51) Int. Cl.
*H01S 3/08* (2006.01)
(52) U.S. Cl.
CPC .............. *H01S 3/08* (2013.01); *H01S 3/08018* (2013.01); *H01S 3/08022* (2013.01); *H01S 3/08027* (2013.01); *H01S 3/08031* (2013.01)
(58) Field of Classification Search
CPC ... H01S 3/08; H01S 3/08018; H01S 3/08022; H01S 3/08027; H01S 3/08031
See application file for complete search history.

(56) References Cited

U.S. PATENT DOCUMENTS

| | | | |
|---|---|---|---|
| 6,845,108 B1* | 1/2005 | Liu et al. | 372/20 |
| 7,962,044 B2* | 6/2011 | McCallion et al. | 398/192 |
| 2002/0075910 A1* | 6/2002 | Imaki et al. | 372/29.02 |
| 2006/0239306 A1* | 10/2006 | Donohoe et al. | 372/20 |
| 2012/0033700 A1* | 2/2012 | Soejima et al. | 372/50.1 |
| 2015/0077853 A1* | 3/2015 | Wan | 359/566 |

FOREIGN PATENT DOCUMENTS

JP 2012-033807 A 2/2012

OTHER PUBLICATIONS

"Packaged Frequency-Stable Tunable 20 kHz Linewidth 1-5 μm InGaAsP External Cavity Laser," Electronics Letters, vol. 21, No. 3, pp. 113-115, 1985.

* cited by examiner

*Primary Examiner* — Armando Rodriguez
(74) *Attorney, Agent, or Firm* — McGinn IP Law Group, PLLC

(57) ABSTRACT

A laser light source includes an optical resonator and a first optical filter. The first optical filter is provided outside the optical resonator, and does not constitute an optical resonator structure. For example, antireflection coating is performed on the optical resonator side of the first optical filter and on a surface on the opposite side thereto, and a reflection structure in which light after passing through the first optical filter is reflected in the direction to the optical resonator is not present on an optical path of the light.

13 Claims, 4 Drawing Sheets

10

10

LASER LIGHT SOURCE

This application is based on Japanese patent application No. 2013-182789, the content of which is incorporated hereinto by reference.

BACKGROUND

1. Technical Field

The present invention relates to a laser light source.

2. Related Art

As light sources that emit laser light, laser light sources that emit light having a narrow spectrum line-width are required.

The line-width of laser light is inversely proportional to the square of a resonator length when a loss of a waveguide constituting an optical resonator is sufficient small. On the other hand, the line-width is inversely proportional to the resonator length when the waveguide loss is large.

Electronics Letters, vol. 21, No. 3, pp 113-115, 1985 discloses that the contraction of a spectrum line-width is achieved by increasing the length of an optical resonator.

However, the inventor has found the following various problems. When the length of the optical resonator is increased, adjacent longitudinal mode light having high intensities is generated. When multiple-stage optical filters are provided within the optical resonator in order to prevent the adjacent longitudinal mode light from being output, the waveguide loss of the optical resonator increases, and a contraction effect of the line-width due to an increase in its length is reduced.

Japanese Unexamined Patent Publication No. 2012-33807 discloses that a reduction in line-width is performed without increasing a resonator length by adjusting the amount of detuning of the optical filter which is inserted into the optical resonator, but the structure of the optical resonator becomes complicated.

An object of the present invention is to provide a laser light source that outputs light having a narrow spectrum line-width using an optical resonator of a simple structure.

SUMMARY

In one embodiment, there is provided a laser light source including: an optical resonator; and a first optical filter, provided outside the optical resonator, which does not constitute an optical resonator structure.

In another embodiment, there is provided a laser light source including: an optical resonator; and a first optical filter provided outside the optical resonator, wherein antireflection coating is performed on the optical resonator side of the first optical filter and on a surface on the opposite side thereto, and a reflection structure in which light after passing through the first optical filter is reflected in a direction to the optical resonator is not present on an optical path of the light.

According to the present invention, it is possible to provide a laser light source that outputs light having a narrow spectrum line-width using an optical resonator of a simple structure.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
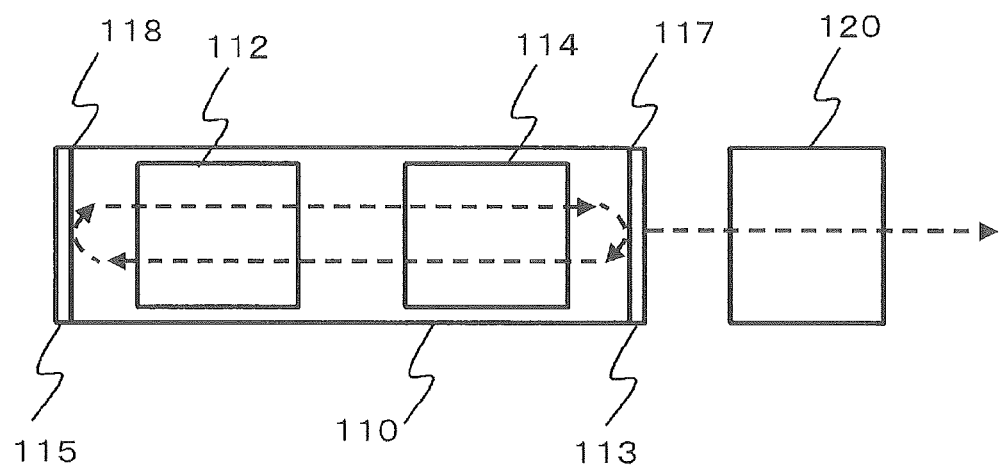
FIG. 1 is a diagram illustrating a structure of a laser light source according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In all the drawings, like elements are referenced by like reference numerals and descriptions thereof will not be repeated.

Meanwhile, in the following description, a control unit of a laser light source exhibits a functional unit block rather than a configuration of a hardware unit. The control unit of the laser light source is realized by any combination of hardware and software with a focus on a CPU, a memory, a program for realizing components of the drawings loaded into the memory, storage media, such as a hard disk, which stores the program, and an interface for network connection of any computer. There are various modified examples in realization methods thereof and devices.

First Embodiment

FIG. 1 is a diagram illustrating a structure of a laser light source 10 according to a first embodiment. In the drawing, dashed lines schematically show a path of light. According to the present embodiment, the laser light source 10 includes an optical resonator 110 and a first optical filter 120. The first optical filter 120 is provided outside the optical resonator 110, and does not constitute an optical resonator structure.

For example, antireflection coating is performed on the optical resonator 110 side of the first optical filter 120 and on the surface on the opposite side thereto, and a reflection structure in which light is reflected in the direction to the optical resonator 110 is not present on an optical path of light after passing through the first optical filter 120.

A detailed description will be given below.

The first optical filter 120 is provided outside the optical resonator 110, and transmits only light having a desired frequency in light which is output from the optical resonator 110. The optical resonator 110 includes a second optical filter 112 and a gain unit 114 therein. The second optical filter 112 is provided inside the optical resonator 110. A first reflecting mirror 113 is provided on a first surface 117 which is an output surface of light of the optical resonator 110, and a second reflecting mirror 115 is provided on a second surface 118 facing the first surface 117.

The incident surface and the emission surface of the first optical filter 120 are given antireflection coating, and the first optical filter 120 does not constitute an optical resonator structure including the optical resonator 110. In addition, the laser light source 10 does not have a reflection structure in which light is reflected in the direction to the optical resonator 110, on the optical path of light after passing through the first optical filter 120.

Power is input to the gain unit 114, and light is generated. Only light having a specific frequency in the generated light passes through the second optical filter 112, and is oscillated by the repetition of reflection from the first reflecting mirror 113 and the second reflecting mirror 115 and amplification in the gain unit 114. The oscillated light is output to the outside of the optical resonator 110. The distance between the first reflecting mirror 113 and the second reflecting mirror 115 is equivalent to a resonator length. In FIG. 1, an example is shown in which the gain unit 114 is provided on the first surface 117 side and the second optical filter 112 is provided on the second surface 118 side, but it may be configured such that the second optical filter 112 is provided on the first surface 117 side and the gain unit 114 is provided on the second surface 118 side.

The light which is output from the optical resonator 110 is incident on the first optical filter 120. The first optical filter 120 transmits only light having a frequency of a desired oscillation mode, and removes light having frequencies of longitudinal modes adjacent to the oscillation mode (adjacent longitudinal mode light). The resonator length of the optical resonator 110 is adjusted in order to obtain a desired line-width. In the present embodiment, the resonator length of the optical resonator 110 is, for example, 5 mm.

Figure 2:
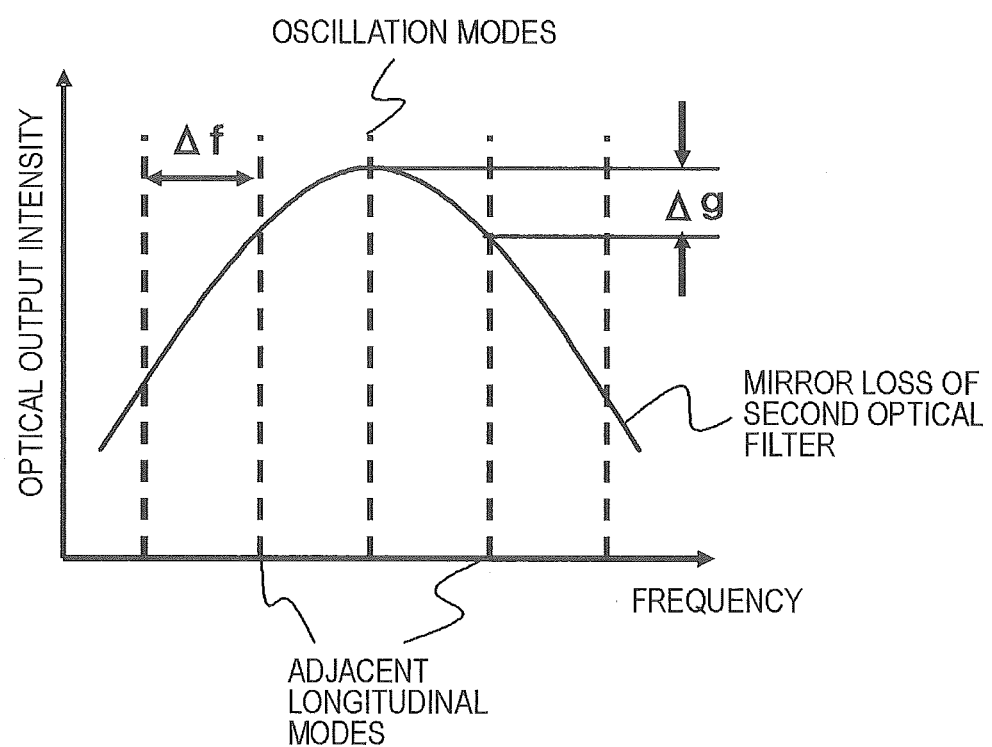
FIG. 2 is a diagram illustrating an oscillation mode and a longitudinal mode spacing in an optical resonator.

FIG. 2 is a diagram illustrating an oscillation mode and a longitudinal mode spacing in the optical resonator. A spectrum line-width (hereinafter, simply called a line-width) in the optical resonator is represented by Equation (1).

[Equation 1]

$$\Delta v = \frac{R_{spon}}{4\pi S}(1+\alpha^2) \quad (1)$$

Here, $\Delta v$ is the line-width of the laser light source, $R_{spon}$ is a spontaneous emission rate, S is the average number of photons within the optical resonator, and $\alpha$ is a line-width enhancement factor. $R_{spon}$ is represented by Equation (2), and S is represented by Equation (3).

[Equation 2]

$$R_{spon} = v_g n_{sp}(\alpha_m + \alpha_L) \quad (2)$$

[Equation 3]

$$S = \frac{2P_0}{h v \alpha_m v_g} \quad (3)$$

Here, $v_g$ represents the group velocity of light, $n_{sp}$ represents a spontaneous emission coefficient, $\alpha_m$ represents the mirror loss of the optical resonator, $\alpha_L$ represents the internal loss thereof, $P_0$ represents an optical output intensity from the one-sided end surface of the optical resonator, and $hv$ represent the photon energy of the oscillation mode. Here, $\alpha_m$ is represented by Equation (4).

[Equation 4]

$$\alpha_m = \frac{1}{2L}\ln\left(\frac{1}{R_1 R_2}\right) \quad (4)$$

Here, L represents a resonator length, and $R_1$ and $R_2$ represent the reflectance of light in each end surface of the optical resonator. Equation (5) is obtained from Equations (1) to (4).

[Equation 5]

$$\Delta v = \frac{v_g^2 n_{sp} hv}{8\pi P_0} \frac{1}{2L}\ln\left(\frac{1}{R_1 R_2}\right)\left(\frac{1}{2L}\ln\left(\frac{1}{R_1 R_2}\right) + \alpha_L\right)(1+\alpha^2) \quad (5)$$

Therefore, it turns out that the line-width is inversely proportional to the square of the resonator length L in a region of which the internal loss $\alpha_L$ is small, and that the line-width is inversely proportional to the resonator length L in a region of which the internal loss $\alpha_L$ is large. That is, it turns out that the internal loss $\alpha_L$ is preferably designed to be small when a contraction effect of the line-width associated with an increase in the length of the optical resonator is desired.

Next, the longitudinal mode spacing $\Delta f$ of the optical resonator is represented by Equation (6). Here, $n_{eq}$ is an equivalent refractive index, and c is the velocity of light in vacuum. Therefore, it turns out that the longitudinal mode spacing is inversely proportional to the resonator length.

[Equation 6]

$$\Delta f = \frac{c}{2n_{eq}L} \quad (6)$$

From the above, it is possible to calculate the longitudinal mode spacing of the optical resonator when the length of the optical resonator is increased in order to obtain a desired line-width.

FIG. 2 illustrates a relationship between the longitudinal mode of the optical resonator and the mirror loss of the optical filter within the optical resonator. The difference between the mirror loss in the frequency of the oscillation mode and the mirror loss in the adjacent longitudinal mode is called an oscillation threshold gain difference $\Delta g$. As $\Delta g$ becomes large, the selectivity and stability of the oscillation frequency become satisfactory.

When the length of the optical resonator is increased, the longitudinal mode spacing decreases as described earlier. Therefore, when the characteristics of the mirror loss of the optical filter provided within the optical resonator remain unchanged, the difference $\Delta g$ decreases. For this reason, the selectivity and stability of the oscillation frequency deteriorate.

In order to prevent such an output of adjacent longitudinal mode light, it is considered that the optical filter be multi-staged in the inside of the optical resonator. However, in this case, the internal loss of the optical resonator increases, and the contraction effect of the line-width associated with an increase in the length of the optical resonator decreases. In addition, since many electric input terminals for optical filter adjustment, and the like are required to be disposed, the complexity of an operation or an increase in cost are caused.

In the laser light source 10 according to the present embodiment, the first optical filter 120 is provided outside the optical resonator 110. Therefore, it is possible to remove the light of the adjacent longitudinal mode without damaging the contraction effect of the line-width associated with an increase in the length of the optical resonator. In addition, the configuration of the optical resonator is not also complicated.

It is preferable that the first optical filter 120 have a transmission bandwidth smaller than twice the longitudinal mode spacing of the optical resonator 110 so as to pass through one of a plurality of longitudinal modes included in the light which is output from the optical resonator 110. Meanwhile, the transmission bandwidth indicates a range in which the transmissivity of light power is equal to or more than half of the maximum point.

Referring back to FIG. 1, a structure of the laser light source 10 according to the present embodiment will be described in detail. The laser light source 10 includes the optical resonator 110 and the first optical filter 120. The optical resonator 110 includes the gain unit 114 and the second optical filter 112. Further, the reflecting mirrors 113 and 115 are provided on the first surface 117 and the second surface 118 of the optical resonator 110.

The gain unit 114 generates and amplifies light through a power input. The gain unit 114 has a structure, for example, in which an InGaAsP-based material layer or an InGaAsAs-based material layer is formed on an InP substrate.

The second optical filter 112 transmits only light having a specific frequency in the light generated in the gain unit 114. The second optical filter 112 is, for example, a ring resonator, a Mach-Zehnder interferometer, a distributed Bragg reflector (DBR), and the like. It is preferable that the second optical filter 112 have frequency selectivity and be capable of tuning the oscillation frequency. The tuning of the oscillation frequency can be performed by changing the refractive index of the optical filter through, for example, a plasma effect by current injection, temperature regulation, or the like.

The reflecting mirrors 113 and 115 repeatedly reflect light on both ends of the optical resonator 110. A laser oscillation is generated by repeating amplification in the gain unit 114, frequency selection in the second optical filter 112, and reflection on the reflecting mirrors 113 and 115.

When the reflectances of the two reflecting mirrors 113 and 115 are the same as each other, light having the same intensity is output from both the reflecting mirrors 113 and 115. In the present embodiment, the reflectances of the reflecting mirrors 113 and 115 are adjusted in order to output light only from the first surface 117. Specifically, low reflection (LR) coating is performed on the reflection surface of the first reflecting mirror 113 in order to reduce the reflectance of the first reflecting mirror 113 and increase the intensity of the light which is output from the first surface 117. On the other hand, high reflection (HR) coating is performed on the reflection surface of the second reflecting mirror 115 in order to increase the reflectance of the second reflecting mirror 115 and decrease the intensity of the light which is output from the second surface 118. It is preferable that the reflectance of the first reflecting mirror 113 be set to 3 to 10%, and the reflectance of the second reflecting mirror 115 be set to around 90%.

The first optical filter 120 is disposed in front of the first surface 117 of the optical resonator 110, and transmits only light having a desired frequency in the light which is output from the first surface 117. The first optical filter 120 is, for example, a fiber Bragg grating (FBG). The first optical filter 120 is not disposed in any path of the optical resonator. That is, the first optical filter 120 is not a component of the optical resonator.

Meanwhile, the optical resonator 110 according to the present embodiment is not necessarily required to include the second optical filter 112. The reason is because it is possible to control the light which is output from the optical resonator 110 by controlling the temperature of the optical resonator 110, and to obtain the light having a desired frequency by passing light through the first optical filter 120.

The laser light source 10 according to the present embodiment can also be configured such that the optical resonator 110 and the first optical filter 120 are mounted on the same substrate. In addition, the laser light source 10 can also be configured such that the optical resonator 110 and the first optical filter 120 are integrated in a semiconductor substrate. The laser light source 10 is created on a semiconductor substrate having a small area, thereby allowing a reduction in cost and a reduction in size to be achieved.

In the optical resonator 110, the second optical filter 112, the gain unit 114 and the reflecting mirrors 113 and 115 may also be formed as an integral structure. In that case, the end surface of a substrate including the second optical filter 112 and the gain unit 114 can also be used as the reflecting mirrors 113 and 115.

Figure 3:
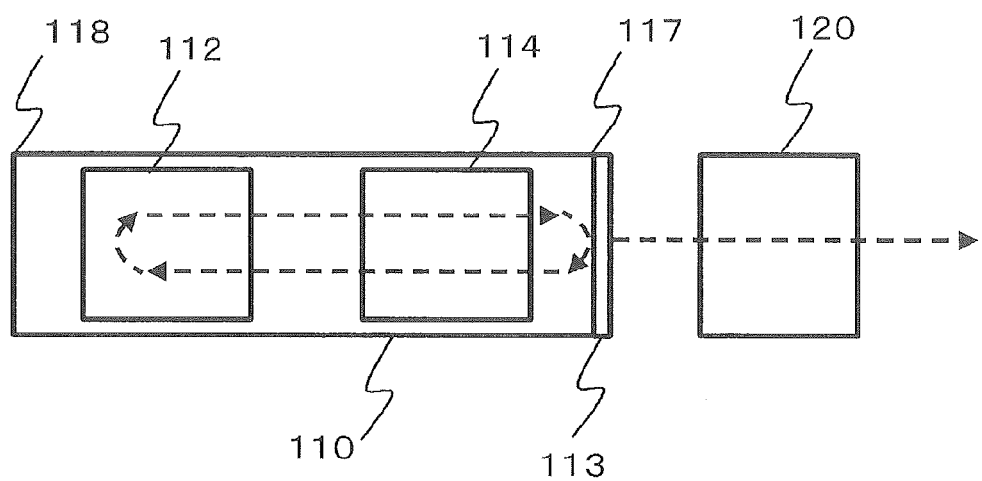
FIG. 3 is a diagram illustrating a modified example of an optical resonator according to the first embodiment.

FIG. 3 is a diagram illustrating a modified example of the optical resonator 110 according to the present embodiment. In the present embodiment, a description has been given of an example in which the optical resonator 110 is a Fabry-Perot type including two reflecting mirrors 113 and 115, but the optical resonator 110 may be also formed, for example, as a loop type in which only the first surface 117 of the optical resonator 110 is provided with the reflecting mirror as shown in FIG. 3, and the path of light is formed in a loop shape in the inside of the optical resonator 110. In the drawing, dashed lines schematically show the path of light. In this case, even when the end surface coating as described earlier is not performed, light can be output only from the first surface 117. For example, when the optical resonator 110 is formed on a substrate, an optical waveguide is formed in a loop shape so as not to come into contact with the end surface of a semiconductor substrate. FIG. 3 illustrates an example in which the loop is formed in the second optical filter 112, but the loop may be formed in the gain unit 114, formed in the second optical filter 112, and formed in regions other than those. In the loop-type optical resonator 110, the length of the path of light from the first reflecting mirror 113 by which the light is reflected, through the loop and back to the first reflecting mirror 113 on which the light is incident again is equivalent to the resonator length.

Next, the effects and operations of the present embodiment will be described. In the laser light source 10 according to the present embodiment, the first optical filter 120 is provided outside the optical resonator 110, and the adjacent longitudinal mode light which is output from the optical resonator 110 is removed. Thereby, it is possible to output narrow line-width laser light excellent in the selectivity and stability of the oscillation frequency.

In addition, the laser light source 10 according to the present embodiment is excellent in the contraction effect of the line-width associated with an increase in the length of the optical resonator 110 due to providing the first optical filter 120 outside the optical resonator 110. Since the optical filter is not required to be added inside the optical resonator, an increase in the internal loss is not caused. Thereby, the laser light source 10 can output laser light having a narrow line-width.

In addition, in the laser light source 10 according to the present embodiment, the first optical filter 120 is provided outside the optical resonator 110, and thus an operation of simplicity and a reduction in cost can be realized. Since the optical filter is not required to be added inside the optical resonator 110, it is not necessary to increase the number of electric input terminals for adjusting the optical filter, and the like.

Second Embodiment

Figure 4:
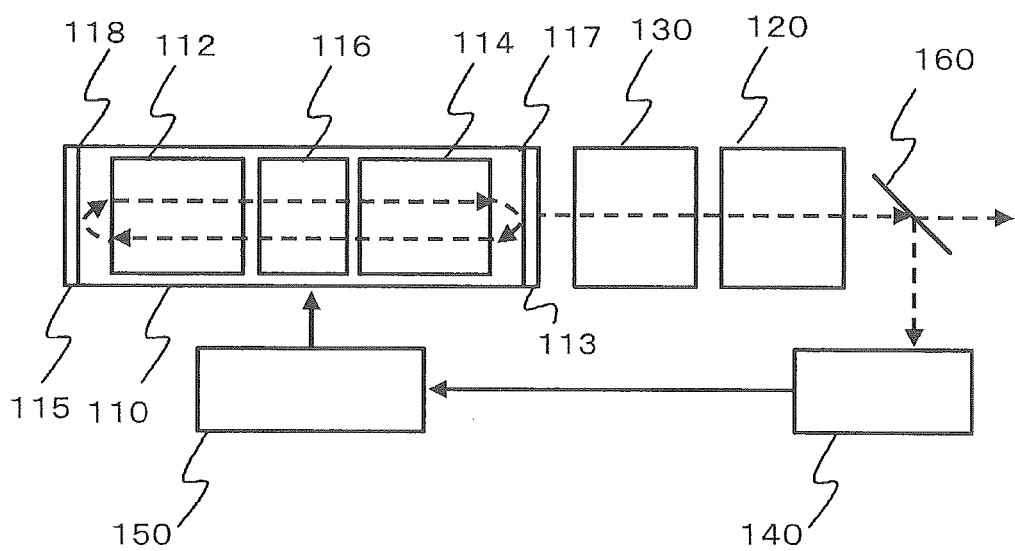
FIG. 4 is a diagram illustrating a configuration of laser light source according to a second embodiment.

FIG. 4 is a diagram illustrating a configuration of a laser light source 10 according to a second embodiment. The laser light source 10 according to the present embodiment includes an optical isolator 130, an optical monitor 140, and a control unit 150 in addition to the configuration of the laser light source 10 according to the first embodiment, and includes a phase adjustment unit 116 in the optical resonator 110. Besides, except for points described below, the laser light source 10 according to the present embodiment is the same as the laser light source 10 according to the first embodiment.

The laser light source 10 according to the present embodiment includes the optical resonator 110, the optical isolator 130, the first optical filter 120, the optical monitor 140, and the control unit 150. The optical resonator 110 includes the second optical filter 112, the phase adjustment unit 116, and the gain unit 114 therein. The first reflecting mirror 113 is provided on the first surface 117 of the optical resonator 110, and the second reflecting mirror 115 is provided on the second surface 118. The first optical filter 120 is provided outside the optical resonator 110, and does not constitute an optical resonator structure.

The optical isolator 130 is provided between the optical resonator 110 and the first optical filter 120. The optical isolator 130 blocks optical feedback from the first optical filter 120 to the optical resonator 110. When the optical isolator 130 is provided in this manner, antireflection coating is not required to be performed on the first optical filter 120. In addition, the laser light source 10 may have a reflection structure in which light is reflected in the direction to the optical resonator 110, on the optical path of light after passing through the first optical filter 120.

A half mirror 160 is further provided at a position reached by the light after passing through the first optical filter 120. The half mirror 160 reflects a portion of the light having passed through the first optical filter 120, and guides the reflected light to the optical monitor 140. Light which is not reflected passes through the half mirror 160, and is output to the outside of the laser light source 10.

The optical monitor 140 monitors the frequency of the light incident on the optical monitor 140, that is, the frequency of the light which is output from the first optical filter 120. The monitored frequency is input to the control unit 150. The control unit 150 controls the frequency of output light of the optical resonator 110 on the basis of the frequency monitored by the optical monitor 140. A detailed description will be given below.

The optical resonator 110 according to the present embodiment includes the phase adjustment unit 116 therein. FIG. 4 shows a diagram in which the phase adjustment unit 116 is disposed between the second optical filter 112 and the gain unit 114, but there is no limitation thereto. The phase of the light passing through the phase adjustment unit 116 is adjusted. As a result, the oscillation frequency of the optical resonator 110 is adjusted in a range smaller than the longitudinal mode spacing. The phase adjustment unit 116 has a structure, for example, in which a layer made of an InGaAsP-based material is formed on an InP substrate. The refractive index of the optical path in the phase adjustment unit 116 can be adjusted based on the amount of current which is input to the phase adjustment unit 116.

The second optical filter 112 provided inside the optical resonator 110 includes a plurality of optical filters. The plurality of optical filters are included, and thus it is possible to increase the variable width of the frequency. In addition, the second optical filter 112 includes a plurality of different types of optical filters. Thereby, the optical filter which is difficult to realize by a combination of optical filters of the same type is formed. For example, the second optical filter 112 has a structure having a combination of a ring resonator of which the free spectral range (FSR) is small and which allows a filter suitable for fine adjustment to be easily realized with a Mach-Zehnder interferometer of which the FSR is large and which allows a filter suitable for coarse adjustment to be easily realized.

The optical isolator 130 is provided between the optical resonator 110 and the first optical filter 120. The optical isolator 130 prevents light from returning from the first optical filter 120 side to the optical resonator 110 side. As the optical isolator 130, those which are available commercially can be used, but those which are formed on a semiconductor substrate may be used for the purpose of a further reduction in size. In addition, the optical isolator 130 can also be formed on the same substrate as the optical resonator 110.

A portion of the light which is output from the optical resonator 110 and passes through the optical isolator 130 and the first optical filter 120 is incident on the optical monitor 140 through the half mirror 160. The optical monitor 140 monitors the frequency of the incident light. The optical monitor 140 has, for example, a Fabry-Perot etalon of which FSR is determined by a specific value, and a photodiode. A change in frequency is converted into a change in light intensity by the Fabry-Perot etalon, and the light intensity is monitored by the photodiode. Information of the change in frequency monitored by the optical monitor 140 is input to the control unit 150.

The control unit 150 controls the phase adjustment unit 116 on the basis of the information of the change in frequency which is input from the optical monitor 140. That is, the phase adjustment unit 116 is controlled so the desired frequency of the light which is output from the laser light source 10 and the frequency of the light which is output from the optical resonator 110 conform to each other. As a control method, feedback control can be used.

Meanwhile, in the laser light source 10 according to the present embodiment, the control unit 150 controls the frequency of the output light of the optical resonator 110 by controlling the phase adjustment unit 116, but there is no limitation thereto. The control unit 150 may controls the second optical filter 112, and may controls the temperature of the optical resonator 110.

Meanwhile, in the present embodiment, a description has been given of an example in which the optical isolator 130, the optical monitor 140, the control unit 150, and the phase adjustment unit 116 are included in addition to the configuration of the laser light source 10 according to the first embodiment, but all of these components are not necessarily included. In addition, a description has been given of an example in which the second optical filter 112 include a plurality of optical filters, but the second optical filter 112 is not necessarily required to include a plurality of optical filters.

Next, the effects and operations of the present embodiment will be described. In the present embodiment, the same effects and operations as those in the first embodiment are obtained. Additionally, the following effects and operations are obtained.

In the optical resonator 110 which does not include the phase adjustment unit 116, the frequency of the output light is finely adjusted using a change in the refractive index of the light path associated with a change in the temperature of the optical resonator 110. On the other hand, the laser light source 10 according to the present embodiment has the phase adjustment unit 116 included inside the optical resonator 110, thereby allowing the frequency of the output light to be finely adjusted at high speed. In addition, it is possible to prevent the optical output from decreasing due to a rise in the temperature of the gain unit 114 or prevent the frequency characteristics of the first optical filter 120 from changing due to an incidental change in the temperature of the first optical filter 120, and to stably control the output light.

The laser light source 10 according to the present embodiment includes the optical isolator 130 between the optical resonator 110 and the first optical filter 120, and thus it is possible to prevent light from returning to the optical resonator 110, and to prevent an unstable operation associated with the internal reflection of the laser light source 10 from occurring.

The laser light source 10 according to the present embodiment includes the optical monitor 140 and the control unit 150, and the frequency of the output light from the optical resonator 110 is controlled. Thereby, it is possible to stabilize the frequency of the light which is output from the laser light source 10, and to maximize the intensity of the output light.

As described above, although the embodiments of the present invention have been set forth with reference to the drawings, they are merely illustrative of the present invention, and various configurations other than those stated above can be adopted.

Hereinafter, examples of reference forms are appended.

1. A laser light source including:
   an optical resonator; and
   a first optical filter, provided outside the optical resonator, which does not constitute an optical resonator structure.

2. A laser light source including:
   an optical resonator; and
   a first optical filter provided outside the optical resonator,
   wherein antireflection coating is performed on the optical resonator side of the first optical filter and on a surface on the opposite side thereto, and
   a reflection structure in which light after passing through the first optical filter is reflected in a direction to the optical resonator is not present on an optical path of the light.

3. The laser light source according to 1 or 2, wherein the optical resonator and the first optical filter are mounted over the same substrate.

4. The laser light source according to any one of 1 to 3, wherein the first optical filter has a transmission bandwidth smaller than twice a longitudinal mode spacing of the optical resonator.

5. The laser light source according to any one of 1 to 4, further including a second optical filter provided inside the optical resonator.

6. The laser light source according to 5, wherein the second optical filter is any of a ring resonator, a Mach-Zehnder interferometer, and a distributed Bragg reflector.

7. The laser light source according to any one of 1 to 6, further including a phase adjustment unit provided inside the optical resonator.

8. The laser light source according to any one of 1 to 7, further including an optical isolator that blocks optical feedback from the first optical filter to the optical resonator, between the optical resonator and the first optical filter.

9. The laser light source according to any one of 1 to 8, further including:
   an optical monitor that monitors a frequency of light which is output from the first optical filter; and
   a control unit that controls a frequency of output light of the optical resonator on the basis of the frequency monitored by the optical monitor.

10. The laser light source according to any one of 1 to 9, wherein the optical resonator is any of a Fabry-Perot type and a loop type.

11. The laser light source according to 5, wherein the second optical-filter includes a plurality of optical filters.

It is apparent that the present invention is not limited to the above embodiment, and may be modified and changed without departing from the scope and spirit of the invention.

What is claimed is:

1. A laser light source, comprising:
   an optical resonator;
   a first optical filter, provided outside the optical resonator, which does not constitute an optical resonator structure; and
   a second optical filter provided inside the optical resonator,
   wherein the laser light source is devoid of any optical elements being placed between the optical resonator and the first optical filter,
   wherein one of a plurality of longitudinal modes of the optical resonator passes through the first optical filter, and
   wherein light which passes through the first optical filter is output to an outside of the laser light source.

2. The laser light source according to claim 1, wherein the second optical filter comprises one of a ring resonator, a Mach-Zehnder interferometer, and a distributed Bragg reflector.

3. A laser light source, comprising:
   an optical resonator;
   a first optical filter, provided outside the optical resonator, which does not constitute an optical resonator structure; and
   a phase adjustment unit provided inside the optical resonator,
   wherein the laser light source is devoid of any optical elements being placed between the optical resonator and the first optical filter,
   wherein one of a plurality of longitudinal modes of the optical resonator passes through the first optical filter, and
   wherein light which passes through the first optical filter is output to an outside of the laser light source.

4. A laser light source, comprising:
   an optical resonator; and
   a first optical filter, provided outside the optical resonator, which does not constitute an optical resonator structure,
   wherein the laser light source is devoid of any optical elements being placed between the optical resonator and the first optical filter,
   wherein one of a plurality of longitudinal modes of the optical resonator passes through the first optical filter,
   wherein light which passes through the first optical filter is output to an outside of the laser light source, and
   wherein the optical resonator comprises one of a Fabry-Perot type and a loop type.

5. A laser light source, comprising:
   an optical resonator; and
   a first optical filter provided outside the optical resonator,
   wherein antireflection coating is performed on an optical resonator side of the first optical filter and on a surface on an opposite side thereto,
   wherein a reflection structure in which light after passing through the first optical filter is reflected in a direction to the optical resonator is not present on an optical path of the light,
   wherein the laser light source is devoid of any optical elements being placed between the optical resonator and the first optical filter,
   wherein one of a plurality of longitudinal modes of the optical resonator passes through the first optical filter, and wherein light which passes through the first optical filter is output to an outside of the laser light source.

6. The laser light source according to claim 5, further comprising a second optical filter provided inside the optical resonator.

7. The laser light source according to claim 5, wherein the optical resonator and the first optical filter are integrated in a same semiconductor substrate.

8. The laser light source according to claim 5, wherein the plurality of longitudinal modes depend on a resonator length of the optical resonator.

9. The laser light source according to claim 5, wherein said one of the plurality of longitudinal modes is inversely proportional to a resonator length of the optical resonator.

10. The laser light source according to claim 5, wherein light which is output from the optical resonator directly enters the first optical filter.

11. The laser light source according to claim 5, wherein an entirety of light which is output from the optical resonator directly enters the first optical filter.

12. The laser light source according to claim 5, wherein light which is output from the first optical filter is directly output to the outside of the laser light source.

13. The laser light source according to claim 5, wherein an entirety of light which is output from the first optical filter is directly output to the outside of the laser light source.

* * * * *